US009183980B2

(12) United States Patent
Hamberger et al.

(10) Patent No.: US 9,183,980 B2
(45) Date of Patent: Nov. 10, 2015

(54) ARRANGEMENT AND METHOD FOR THE COMPENSATION OF A MAGNETIC UNIDIRECTIONAL FLUX IN A TRANSFORMER CORE

(75) Inventors: Peter Hamberger, Kirchschlag bei Linz (AT); Albert Leikermoser, Salzburg (AT)

(73) Assignee: SIEMENS AKTIENGESELLSCHAFT, München (DE)

( * ) Notice: Subject to any disclaimer, the term of this patent is extended or adjusted under 35 U.S.C. 154(b) by 398 days.

(21) Appl. No.: 13/876,631

(22) PCT Filed: Sep. 29, 2010

(86) PCT No.: PCT/EP2010/064393
§ 371 (c)(1),
(2), (4) Date: Mar. 28, 2013

(87) PCT Pub. No.: WO2012/041367
PCT Pub. Date: Apr. 5, 2012

(65) Prior Publication Data
US 2013/0207483 A1    Aug. 15, 2013

(51) Int. Cl.
| H01F 27/34 | (2006.01) |
| H01F 29/14 | (2006.01) |
| H01F 27/42 | (2006.01) |
| H03H 7/09 | (2006.01) |
| H03H 7/01 | (2006.01) |

(52) U.S. Cl.
CPC ............... *H01F 27/34* (2013.01); *H01F 29/14* (2013.01); *H01F 27/42* (2013.01); *H01F 2029/143* (2013.01); *H03H 7/09* (2013.01); *H03H 7/1766* (2013.01)

(58) Field of Classification Search
CPC ......... H01F 27/34; H01F 29/14; H01F 27/42; H03H 7/09
See application file for complete search history.

(56) References Cited

U.S. PATENT DOCUMENTS

| 2,730,667 | A |   | 1/1956 | Uhlmann |
| 4,255,704 | A | * | 3/1981 | Milkovic ...................... 324/127 |
| 4,255,705 | A | * | 3/1981 | Milkovic ...................... 324/127 |
| 4,278,940 | A | * | 7/1981 | Milkovic ...................... 324/127 |
| 2006/0049890 | A1 |   | 3/2006 | Wasaki et al. |

FOREIGN PATENT DOCUMENTS

| CN | 1656675 A | 8/2005 |
| CN | 101681716 A | 3/2010 |
| DE | 634027 C | 8/1936 |

(Continued)

*Primary Examiner* — Zeev V Kitov

(57) ABSTRACT

An arrangement for reducing a DC field component in the core of a transformer includes a compensation winding magnetically coupled to the core of the transformer, and a DC generator arranged in series with the compensation winding and with a reactance dipole. The reactance dipole is formed from a parallel circuit of an inductance and a capacitor to feed into the compensation winding a compensating current opposite in sense to the DC field component in the core. The inductance is formed from magnetically coupled first and second windings having $N_1$ and $N_2$ turns respectively, such that $N_2/N_1 < 1$. The first winding is connected on one end to the DC generator and on the other end to the compensation winding. The second winding is connected in parallel with the capacitor. The magnetic coupling of the first and second windings is established via a soft magnetic core having an air gap.

5 Claims, 1 Drawing Sheet

(56) References Cited

FOREIGN PATENT DOCUMENTS

| | | |
|---|---|---|
| DE | 10241249 A1 | 3/2004 |
| GB | 2224407 A | 5/1990 |
| JP | 58093370 A | 6/1983 |
| JP | 2063310 B | 12/1990 |
| JP | 2002204137 A | 7/2002 |
| WO | WO 2008151661 A1 | 12/2008 |

* cited by examiner

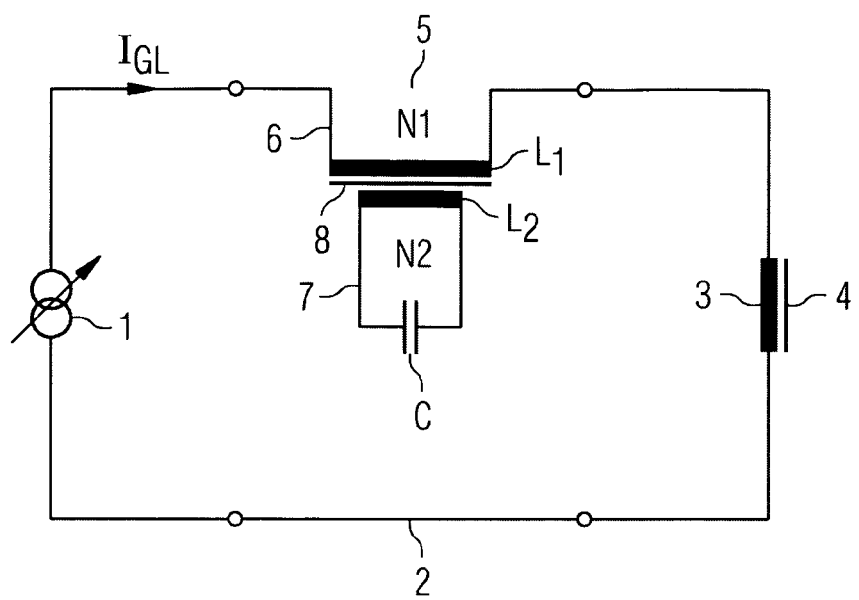

ARRANGEMENT AND METHOD FOR THE COMPENSATION OF A MAGNETIC UNIDIRECTIONAL FLUX IN A TRANSFORMER CORE

CROSS REFERENCE TO RELATED APPLICATIONS

This application is the US National Stage of International Application No PCT/EP2010/064393, filed Sep. 29, 2010 and claims the benefit thereof. All of the applications are incorporated by reference herein in their entirety.

AREA OF TECHNOLOGY

The invention relates to an arrangement and a method for the compensation of a magnetic unidirectional flux in a transformer core, having a DC generator for feeding a compensating current into a compensation winding which is magnetically coupled to the transformer core.

PRIOR ART

Electrical transformers such as are typically used today in a power distribution network are increasingly impacted by a current component, which is to be regarded as a direct current component with regard to the power distribution network. Said direct current component, also referred to as "DC component" in the following, can for example originate from the increased use of power electronic components in the network, such as are normally used for the control of electrical drives or for power factor correction. A "DC component" can however also be caused by so-called "Geomagnetically Induced Currents" (GIC). The consequence of a "DC component" is a magnetic unidirectional flux component in the core. A shift occurs in the magnetic modulation, in other words depending on the half period the modulation takes place at times to a somewhat greater extent, and at other times to a somewhat lesser extent. Since every effort is generally made today to operate the magnetic core material with as high a level of utilization as possible, the modern design of transformer is particularly sensitive with regard to a "DC component".

Although in practice the direct current often only constitutes a few thousandths of the transformer rated current, it leads to a series of disruptive effects. Since the magnetizing current is no longer sinusoidal but is distorted, this results in local warming in the transformer core and in the electrical winding. Local warming, so-called "hot spots", can adversely affect the insulation properties of the electrical winding. On account of the greater magnetostriction, the noise emission occurring during operation of the transformer is moreover increased. An increased noise development is however disadvantageous in particular in the situation when the transformer is to be installed in the vicinity of a residential area. It is therefore desirable to keep the magnetic unidirectional flux component in the transformer core as small as possible.

One possible way of reducing the disruptive unidirectional flux component consists in arranging on the transformer core a compensation winding, into which is fed by means of a controllable direct current source a compensating current which is in the opposite direction to the unidirectional flux component. In this situation the problem occurs that an electrical voltage of an order of magnitude which signifies a very high burden voltage for the infeeding direct current source is induced in the compensation winding.

In PCT/EP20007/055728 it is therefore proposed to establish the coupling between the direct current source and the compensation winding by way of a rejection circuit, a so-called reactance dipole. In its simplest form said reactance dipole consists of a parallel circuit of a capacitor and an inductance. Since almost the entire induced voltage drops at the reactance dipole, the capacitor must be designed for this high voltage. In the case of transformers with a high output, in other words a high operating voltage, very high technical requirements result therefrom on the capacitor. Capacitors which meet said requirements are not only very costly but also very bulky. The high operating voltage also adversely affects the reliability of the capacitor and thus that of the reactance dipole.

STATEMENT OF THE INVENTION

The object of the present invention is to specify an arrangement and a method such that it is possible to feed a compensating current into a compensation winding of a transformer with the least possible technical resource requirement and with a high level of reliability.

This object is achieved by an arrangement having the features described in claim 1 and by a method having the features described in claim 5. Advantageous embodiments of the invention are defined in the dependent claims.

According to the invention, with regard to feeding a compensating current into the compensation winding of a transformer a reactance dipole is used wherein the voltage is reduced in the parallel branch of the capacitor. Said reduction in voltage is achieved by the inductance being designed in the manner of a coupling transformer and having two windings: for the purpose of feeding in, a first winding is connected by its one end to the DC generator and by its other end to the compensation winding. A second winding forms a parallel circuit with the capacitor. Through an appropriate choice of the number of turns for the first and second windings it is possible to reduce the voltage load on the capacitor. The reduction of the voltage for the reactance dipole-capacitor can be achieved in a simple manner in that the ratio formed from the number of turns $N_2$ of the second winding and the number of turns $N_1$ of the first winding is formed according to the relationship $N_2/N_1 < 1$. The voltage at the capacitor can as a result be reduced in freely selectable fashion. With regard to the design of the rejection circuit (resonance condition of the parallel circuit) the reduced voltage can be easily compensated for through appropriate choice of the capacitance: compared with a reactance dipole which consists of only one winding, the capacitor must have a capacitance which is higher by $(N_1/N_2)^2$. The reactance dipole therefore exhibits a better technical reliability and is more cost-effective to manufacture. An additional coupling transformer is not required.

Since, as stated, the compensating current flows by way of the first winding the value of said inductance must essentially remain constant, in other words it is to be designed such that as far as possible no saturation effects occur. Provision is therefore made in a preferred embodiment that the magnetic core, which connects the first winding to the second winding, is provided with an air gap.

In order that the voltage induced in the compensation winding drops almost completely across the reactance dipole, the reactance dipole should exhibit as high an impedance as possible for all frequencies, corresponding to an odd integer multiple of the network frequency. But it happens to be the case that the reactance dipole exhibits the greatest impedance for the fundamental oscillation the stronger is the inductive coupling between the first winding and the second winding. Precisely the opposite holds true however for the harmonic: the advantageous impedance for the harmonics exists in the situation when the coupling between the first winding and the second winding is as small as possible. A favorable compromise of said two conflicting requirements in practice exists in the situation when the degree of coupling $\epsilon$ between the first winding and the second winding is formed by the relationship $$\epsilon \neq [(n^2-1)/n^2] \text{ for all } n\{3,5,7,9,\ldots\}$$

BRIEF DESCRIPTION OF THE DRAWINGS

The invention will be explained in detail in the following part of the description with reference to the drawing, from which further advantageous embodiments, effects and advantages of the invention emerge.

In the drawing:

FIG. 1 shows a reactance dipole according to the invention, designed as a parallel resonant circuit, wherein the inductance is formed from a first winding and a second winding.

EMBODIMENT OF THE INVENTION

FIG. 1 shows a compensation winding 3 magnetically coupled to the core 4 of a transformer not shown in detail. For the purpose of reducing or eliminating a unidirectional flux component flowing in the core 4 of the transformer a corresponding compensating current is to be fed into the compensation winding 3. The compensation winding normally consists of only a single winding with a small number of turns.

The compensating current is a direct current and is produced by a DC generator 1. Said DC generator 1 can consist of a controlled semiconductor switching device. The DC generator 1 is connected by way of an electrical circuit 2 to the compensation winding 3. A measurement and control device not shown in detail gives the level of the compensating current $I_{GL}$ fed in.

In order to keep the burden voltage as low as possible for the DC generator 1, the electrical circuit 2 incorporates a reactance dipole 5 which according to the invention is designed as follows:

The reactance dipole 5 consists of a parallel circuit of a capacitance C with an inductance formed according to the invention from two windings 6 and 7 (inductances L1 and L2). The first winding 6 (inductances L1) is situated in the electrical circuit 2 in series with the DC generator 1 and the compensation winding 3. The second winding 7 (inductances L2) lies outside the current path 2 and is connected in parallel with a capacitor C. The voltage present at the capacitor C is reduced by a suitable ratio of the numbers of windings N1 and N2. This enables a cost-effective capacitor to be chosen.

An arrangement is expedient in which only the compensation winding is arranged in the transformer tank and the other components are outside.

In conclusion, the burden voltage of the DC generator 1 is reduced by a simple and reliably functioning circuit device, which means that said device can be implemented cost-effectively.

LIST OF REFERENCE CHARACTERS

1 DC generator
2 Current path
3 Compensation winding
4 Core of the transformer
5 Reactance dipole
6 First winding
7 Second winding
8 Soft magnetic core of the inductance of the reactance dipole
$I_{GL}$ Compensating current

The invention claimed is:

1. An arrangement for reducing a DC field component in the core of a transformer, comprising:
    a compensation winding which is magnetically coupled to the core of the transformer,
    a DC generator which is arranged in series with the compensation winding and with a reactance dipole, wherein the reactance dipole is formed from a parallel circuit of an inductance and a capacitor, in order to feed into the compensation winding a compensating current, the effect of which is in the opposite direction to the DC field component in the core,
    wherein the inductance is formed from a first winding which is magnetically coupled to a second winding, wherein the ratio formed from the number of turns $N_2$ of the second winding and the number of turns $N_1$ of the first winding is formed according to the relationship $N_2/N_1 < 1$,
    wherein the first winding is connected by its one end to the DC generator and by its other end to the compensation winding,
    wherein the second winding is connected in parallel with the capacitor, and
    wherein the magnetic coupling of the first winding and of the second winding is established via a soft magnetic core which has an air gap.

2. The device as claimed in claim 1, wherein the degree of coupling c between the first winding and the second winding is formed by the relationship $$\epsilon \neq [(n^2-1)/n^2] \text{ for all } n\{3,5,7,9,\ldots\}.$$

3. A method for reducing a DC field component in the core of a transformer, wherein a DC generator feeds a compensation current into a compensation winding coupled to the core of the transformer, the effect of the compensation current being in the opposite direction to the DC field component, wherein the compensating current is introduced into an electrical circuit having a reactance dipole, wherein the reactance dipole comprises an inductance and a capacitance,
    providing an arrangement comprising a first coil having a number of turns $N_1$ and a second coil having a number of turns $N_2$ as the inductance, wherein the ratio formed from the number of turns $N_2$ and the number of turns $N_1$ is formed according to the relationship $N_2/N_1 < 1$, and
    coupling the first coil to the second coil via a magnet core which has an air gap.

4. The method as claimed in claim 3, wherein the degree of coupling c between the first winding and the second winding is given by the relationship $$\epsilon \neq [(n^2-1)/n^2] \text{ for all } n\{3,5,7,9,\ldots\}.$$

5. A method for modifying a transformer, on the core of which is arranged at least one compensation coil which is connected to a DC generator in order to feed into the compensation coil a compensating current, the effect of which is in the opposite direction to a unidirectional flux component in the core of the transformer, wherein a method according to claim 3 is carried out.

* * * * *